United States Patent
Xu et al.

(10) Patent No.: US 8,607,125 B2
(45) Date of Patent: Dec. 10, 2013

(54) BASIC MATRIX BASED ON IRREGULAR LDPC, CODEC AND GENERATION METHOD THEREOF

(75) Inventors: Jun Xu, Shenzhen (CN); Liuqing Yuan, Shenzhen (CN); Liujun Hu, Shenzhen (CN)

(73) Assignee: ZTE Corporation, Guangdong P.R. (CN)

( * ) Notice: Subject to any disclaimer, the term of this patent is extended or adjusted under 35 U.S.C. 154(b) by 1610 days.

(21) Appl. No.: 11/795,826

(22) PCT Filed: May 13, 2005

(86) PCT No.: PCT/CN2005/000671
§ 371 (c)(1),
(2), (4) Date: Jul. 23, 2007

(87) PCT Pub. No.: WO2006/076834
PCT Pub. Date: Jul. 27, 2006

(65) Prior Publication Data
US 2008/0168324 A1   Jul. 10, 2008

(30) Foreign Application Priority Data

Jan. 23, 2005  (CN) .......................... 2005 1 0007156

(51) Int. Cl.
*H03M 13/00* (2006.01)
(52) U.S. Cl.
USPC ............ 714/774; 714/779; 714/781; 714/785
(58) Field of Classification Search
USPC .......................................... 714/774, 781, 758
See application file for complete search history.

(56) References Cited

U.S. PATENT DOCUMENTS

| 6,633,856 | B2 * | 10/2003 | Richardson et al. | 706/15 |
| 6,718,508 | B2 * | 4/2004 | Lodge et al. | 714/780 |
| 6,785,863 | B2 * | 8/2004 | Blankenship et al. | 714/799 |

(Continued)

FOREIGN PATENT DOCUMENTS

| CN | 1405981 | 3/2003 |
| CN | 1558556 | 12/2004 |
| WO | WO 2004028074 | 4/2004 |

OTHER PUBLICATIONS

Robert Xu, Liuqing Yuan, Youngang Zhang, Li Zeng: "High Girth LDPC Coding for OFDMA Phy" IEEE C802.16e-04/423 Broadband Wireless Access Working Group, [online] Nov. 3, 2004, pp. 1-13.

(Continued)

*Primary Examiner* — Joseph D Torres
(74) *Attorney, Agent, or Firm* — Husch Blackwell LLP (57) ABSTRACT

The codec includes an encoding/decoding operation module and a basic matrix storage module. In the stored basic matrix Hb, for all girths with length of 4, any column element of i, j, k or l constituting the girths in anti-clockwise or clockwise always satisfies inequality: $(i-j+k-l) \bmod z \neq 0$, wherein z is the extension factor. When generating the basic matrix, firstly the number of rows M, number of columns N, and weight vectors of the rows and columns are determined, an irregularly original basic matrix is constructed; then the position of '1' is filled by a value chosen from set $\{0, 1, 2, \ldots, z-1\}$ to obtain the basic matrix Hb. The basic matrix Hb obtained by storing constitutes the desired encoder/decoder. The encoder/decoder according to the present invention can effectively eliminate error-floor phenomenon of LDPC codes and accelerate the falling speed of BER curve.

7 Claims, 5 Drawing Sheets

(56) References Cited

U.S. PATENT DOCUMENTS

| | | | |
|---|---|---|---|
| 6,789,227 B2 * | 9/2004 | De Souza et al. | 714/804 |
| 7,143,333 B2 * | 11/2006 | Blankenship et al. | 714/781 |
| 7,178,082 B2 * | 2/2007 | Yu et al. | 714/752 |
| 7,260,763 B2 * | 8/2007 | Sukhobok et al. | 714/758 |
| 7,313,752 B2 * | 12/2007 | Kyung et al. | 714/801 |

OTHER PUBLICATIONS

Richardson T.J. et al.,: "Efficient encoding of low-density parity-check codes" IEEE Transactions on Information Theory, vol. 47, No. 2, Feb. 1, 2001, pp. 638-656.

Supplementary Partial European Search Report for related application No. EP05749661.

Dombrowski, J., "Quasitriangular Matrices," Aug. 22, 1977, pp. 95-96.

Benner, Peter; Volker Mehrmann, and Hongguo Xu, "A New Method for the Hamiltonian Eigenvalue Problem," total pp. 5. 2007.

Christian B. Schlegel and Lance C. Pe' rez, Trellis and Turbo Coding, A John Wiley & Sons, Inc., Publication 2004.

Shu Lin, Error Control Coding, Fundamentals and Applications, Prentice-Hall, Inc., Englewood Cliffs, N.J. 07632, 1983.

* cited by examiner fig. 1 fig. 2 fig. 3 fig. 4 fig. 5 fig. 6 fig. 7 fig. 8 fig. 9 fig. 10 fig. 11

BASIC MATRIX BASED ON IRREGULAR LDPC, CODEC AND GENERATION METHOD THEREOF

This application claims priority from Chinese Patent Application No. 200510007156.3, filed Jan. 23, 2005.

TECHNICAL FIELD

The present invention relates to a codec used for data transmission error-correcting in a digital communication system, and more specifically to a codec based on low density parity check code in error-correcting technology in the field of digital communication and a generation method thereof, and the basic matrix used for creating the parity check matrix.

BACKGROUND ART

Figure 1:
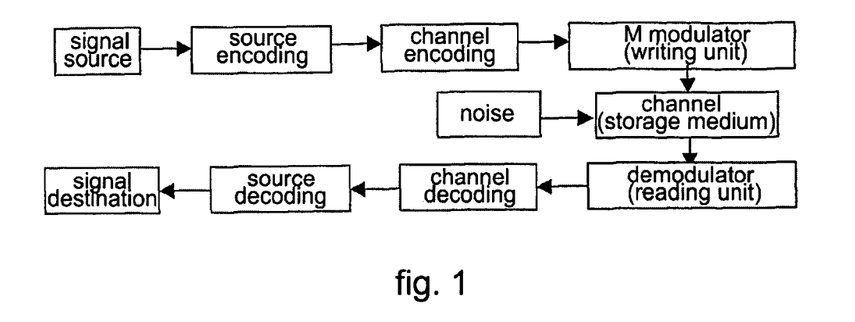
FIG. 1 is a block diagram of the digital communication system.

Data transmission between computes as well as internal operation and storage system of all digital communication systems, such as communication, radar, telecontrol and telemetering, and digital computer can be summarized as the model shown in FIG. 1. The source encoder is used to improve validity of transmission; channel encoder is used to resist various noise and interference during transmission. By increasing artificially redundant information, the system is made to be capable of correcting error automatically so as to ensure the reliability of digital transmission. With the development of the wireless digital communication and the advent of all kinds of services with high speed and burst, there is increased demand for error-correction coding technology.

The initial research of error-correction code is mainly focused on the linear block code based on algebraic theory, followed by a series of good codes such as hamming code, cyclic code, BCH code and RS code. In convolutional code appeared in the 50s, register is introduced in the process of encoding to increase the correlation between code elements, thus higher coding gain than that of the block code can be obtained with the same order of complexity. With the appearance of decoding algorithms of the convolutional code (Viterbi algorithm), it gained intensive research and application. In 1993, C. Berrou and etc. in France offers Turbo code, striding forward to the limitation of encoding performance. Under the inspiration of successful Turbo code, another kind of encoding with similar characteristic and capability regains people's attention, that is, the low density parity check codes (which can be referred to as LDPC code). LDPC code is a kind of linear block code which can be defined by sparse parity check matrix or bipartite graph. It was originally discovered by Gallager, so it is called Gallager code. Through decades' dreariness, with the development of computer hardware and associated theories, MacKay and Neal rediscovered LDPC code and proved that it has performance of approximating Shannon limit. Latest research indicates that LDPC code has the following characteristics: low complexity of decoding, linear time encoding, the performance of approximating Shannon limit, parallel decoding, and better performance than Turbo code under the condition of long code.

LDPC code is a linear block code based on sparse parity check matrix, and it is the sparse characteristic of LDPC that make it possible to realize encoding/decoding with low complexity and make LDPC code move toward practical application. The above-mentioned Gallager code is a regular LDPC code (regular ldpcc), but Luby and Mitzenmacher generalized Gallager code and offered irregular LDPC code (irregular ldpcc). The original code offered by Gallager has regular code structure whose parity check matrix is a sparse matrix with the same number of 1 at each row or each column. M. G. Luby thought that if the number of non-zero elements in each row or column in the check matrix is allowed to change, with the sparse characteristic of the matrix being guaranteed, the decoding algorithm of the code would still be applicable; moreover, the performance of the code can be largely improved, reaching, or even surpassing that of Turbo code. This is because that if the corresponding left node and right node of the bipartite graph have appropriate degree distribution in the code structure, a waveform effect, which will greatly improve the decoding performance, will exist in decoding. Irregular code is such a code that allows the same nodes have different orders of low density coding, yet the original code offered by Gallager is correspondingly called regular code.

Based on unit matrix and its cyclic shift matrix, LDPC code has become research emphasis in current academic circles because of its randomly variable length, simple implementation, and the guaranteed invariable degree distribution and girth (referred to the shortest length of a circle) distribution in expanding. But, the currently constructed LDPC code based on unit matrix and its cyclic shift matrix does not fully take into account the influence of girth and the relationship between code length and girth, so the method for building a LDPC code with as small girth as possible and as few number of girth as possible is far from comprehensive. Therefore, the drop of BER curve dramatically slows down at high signal to noise ratio, and phenomenon of error floor often happens, resulting in decreased code performance. How to eliminate the error-floor phenomenon of LDPC code, accelerate the dropping speed of BER curve, and improve the performance of the LDPC code at high SNR, are the urgent problems to be solved.

The research object of the present invention is mainly irregular codes. Irregular codes are low-density parity-check codes with totally different row weight and column weight of parity check matrix, and column weight of the information bits of the parity check matrix is also different. Regular codes are low density parity check codes with the same row weight and column weight of the parity check matrix, or low density parity check codes with the same row weight and column weight of the information bits when the corresponding check bits maintain constant structure. In relevant literatures, the second case of regular code, the low-density parity-check codes are also called semi-regular codes. The degree distribution of the basic matrix is consistent with that of the parity check matrix.

For irregular codes, since there are many non-zero elements in the parity check matrix, it is hard to ensure that the girth of the parity check matrix can reach 8, but it is easy to ensure that the girth of the parity check matrix can reach 6. It is desirable in the present invention to eliminate the cycles with length of 8 as far as possible under the basic condition that the girth of the parity check matrix reaches 6, thus error floors will be eliminated further; for low density parity check codes with specific code rate and multiple code lengths, the method can ensure FER curves with different code length will not intersect when FER is larger than 10-4, therefore, good irregular low density parity check codes can be designed.

SUMMARY OF THE INVENTION

The present invention resolves the technical problem by offering a basic matrix of irregular low density parity check codes and generation method thereof, to make the generated parity check matrix effectively eliminate the phenomenon of error floors and accelerate the falling speed of BER curve.

In order to solve the foregoing technical problem, the present invention offers a basic matrix of irregular low density parity check codes, and the basic matrix Hb consists of M×(N−M) block A (corresponding to the information bits) and M×M block B corresponding to the check bits, which is characterized in that, the matrix also meets the following condition: for all cycles with length of 4 in the basic matrix Hb, any element of i, j, k and l constituting the cycle in anti-clockwise or clockwise always satisfies the inequality: (i−j+k−l) mod z≠0, wherein mod is modular operation, z is the extension factor.

Furthermore, the above-mentioned basic matrix may also have the following characteristic: said block B corresponding to the check bits applies quasi lower triangular structure.

Furthermore, the above-mentioned basic matrix may also have the following characteristic: the matrix also meets the following condition: suppose the number of the columns with largest weight in the basic matrix Hb is r, in each new basic matrix formed by deleting random r−1 columns herein, for all cycles with length of 4, any element of i, j, k or l constituting the cycle in anti-clockwise or clockwise always satisfies the inequality: (i−j+k−l) mod z≠0; moreover, for all cycles with length of 6, any element of i, j, k, l, m or n constituting the cycle in anti-clockwise or clockwise always satisfies the inequality: (i−j+k−l+m−n) mod z≠0.

Furthermore, the above-mentioned basic matrix may also have the following characteristic: the matrix also meets the following condition: suppose the number of the columns with the largest weight in the basic matrix Hb is r, in each new basic matrix formed by deleting any r−1 columns herein and all columns with weight of 3, for all cycles with length of 4, any element of i, j, k or l constituting the cycle in anti-clockwise or clockwise always satisfies the inequality: (i−j+k−l) mod z≠0; moreover, for all cycles with length of 6, any element of i, j, k, l, m or n constituting the cycle in anti-clockwise or clockwise always satisfies the inequality: (i−j+k−l+m−n) mod z≠0.

Furthermore, the above-mentioned basic matrix may also have the following characteristic: said basic matrix Hb is the unique basic matrix of the low density parity check codes with specific code rate and multiple code lengths, and the value of the elements are corrected according to length of each code, each basic matrix obtained satisfies all inequalities satisfied by the basic matrix before correcting.

In order to solve the foregoing technical problem, the present invention further offers a generation method of the basic matrix of irregular low density parity check codes, which includes the following steps:

(a) the number of rows M and the number of columns N of the basic matrix Hb are determined according to the requirement of code rate and code length; the row weight vector and the column weight vector of the basic matrix Hb are determined according to the requirement of degree distribution;

(b) Construct an original irregular basic matrix Hb' which consists of M×(N−M) block A corresponding to the information bits and M×M block B corresponding to the check bits;

(c) fill positions corresponding to element '1' of the original basic matrix Hb' with values selected from set {0, 1, 2, . . . , z−1} to obtain the basic matrix Hb, and for all cycles in Hb with length of 4, any element of i, j, k and l constituting the cycle in anti-clockwise or clockwise always satisfies the inequality: (i−j+k−l) mod z≠0, where mod is modular operation, and z is the extension factor;

Furthermore, the above-mentioned generation method of the basic matrix may also have the following characteristic: said step (c) further divides into the following steps:

(c1) Suppose there are r heaviest columns in the original basic matrix, firstly, delete all the r heaviest columns from the original basic matrix Hb', then fill positions corresponding to element '1' of the original basic matrix Hb' with values selected from set {0, 1, 2, . . . , z−1} leaving the unfilled positions blank; when filling a position, select the value according to the requirement that girth of the corresponding parity check matrix is no less than 10 (girth≥10); if there is no value meeting the requirement, then select the value according to the requirement that girth of the corresponding parity check matrix is no less than 8 (girth≥8);

The requirement that girth of the corresponding parity check matrix is no less than 10 (girth≥10) is: after a position is filled, for each cycle with length of 4 passing this position, any element of i, j, k and l constituting the cycle in anti-clockwise or clockwise always satisfies the inequality: (i−j+k−l) mod z≠0; for each cycle with length of 6 passing this position, any element of i, j, k, l, m and n constituting the cycle in anti-clockwise or clockwise always satisfies the inequality: (i−j+k−l+m−n) mod z≠0; for each cycle with length of 8 passing this position, any element of i, j, k, l, m, n, s and t constituting the cycle in anti-clockwise or clockwise always satisfies the inequality: (i−j+k−l+m−n+s−t) mod z≠0;

The requirement that girth of the corresponding parity check matrix no less than 8 (girth≥8) is: after a position is filled, for each cycle with length of 4 passing this position, any element of i, j, k and l constituting the cycle in anti-clockwise or clockwise always satisfies the inequality: (i−j+k−l) mod z≠0; for each cycle with length of 6 passing this position, any element of i, j, k, l, m and n constituting the cycle in anti-clockwise or clockwise always satisfies the inequality: (i−j+k−l+m−n) mod z≠0;

(c2) After filling the matrix removed heaviest column, add the $n^{th}$ heaviest column and remove the residual r−1 heaviest columns (n=1, 2, . . . , r) to construct a new basic matrix; select values to fill positions according to element '1' of the heaviest column according to the same method as step (c1), and whenever a required value selected, add the foregoing r−1 heaviest columns to construct another new basic matrix; check whether the girth of the corresponding parity check matrix meets the requirement: girth is ≥6 or not; if yes, fill the next position, otherwise, reselect value for the position and check;

The requirement that girth of the parity check matrix corresponding to the matrix ≥6 is: after a position is filled with selected value, for each cycle with length of 4 passing this position, any element of i, j, k and l constituting the cycle in anti-clockwise or clockwise always satisfies the inequality: (i−j+k−l) mod z≠0;

(c3) After one of the heaviest columns is filled, fill the next heaviest column according to the method of step (c2) until all the r heaviest columns are filled, then the desired basic matrix Hb is obtained.

Furthermore, the above-mentioned generation method of the basic matrix may also have the following characteristic: in said step (c2), if all the selectable values do not meet the requirements, then execute step (c2)': all columns with weight of 3 are deleted to construct a new basic matrix, select values to fill positions according to element '1' of the $n^{th}$ heaviest column according to the same method as step (c1), and whenever a required value selected, add the foregoing r−1 heaviest columns to construct another basic matrix; check whether the girth of the corresponding parity check matrix meets the requirement: girth is ≥6 or not; if yes, fill the next position, otherwise, reselect value for the position and check;

Furthermore, the above-mentioned generation method of the basic matrix may also have the following characteristic: in said step (c1), after a value satisfying the requirement that the corresponding parity check matrix girth ≥10 or girth ≥8 is selected, modify the basic matrix to basic matrices with all other code lengths corresponding to the code rate; for each basic matrix obtained by modification, determine whether the girth of its corresponding parity check matrix is ≥8, if yes, then execute step (c2), otherwise, reselect a value. In said steps (c2) and (c2)', after selected values meeting the corresponding inequalities, the present basic matrix is modified according to each code length, and check whether each obtained basic matrix satisfies the inequality; if yes, the selection is successful, otherwise, another value should be selected.

Furthermore, the above-mentioned generation method of the basic matrix may also have the following characteristic: the size of the basic matrix with code rate of 1/2 is set to be 12×24, the maximum weight of the columns of the basic matrix is selected to be 12; the size of the basic matrix with code rate of 2/3 is set to be 8×24, the maximum weight of the columns of the basic matrix is selected to be 8; the size of the basic matrix with code rate of 3/4 is set to be 6×24, the maximum weight of the columns of the basic matrix is selected to be 6.

Furthermore, the above-mentioned generation method of the basic matrix may also have the following characteristic: said block B applies quasi lower triangular structure.

Furthermore, the above-mentioned generation method of the basic matrix may also have the following characteristic: said original basic matrix is constructed by the bit-filling method, and the number of the shortest cycles during construction is summarized. Preferably the filling value that makes the fewer number of the shortest cycles is selected.

Furthermore, the above-mentioned generation method of the basic matrix may also have the following characteristic: modification of said basic matrix to a basic matrix with other code length is done by acquiring modulus, integrating, or rounding of the non-zero elements of the original basic matrix according to the length of the original basic matrix and the basic matrix to be generated.

The present invention solves another technical problem by offering an encoder and decoder based on irregular low density parity check codes to effectively eliminate error-floor phenomenon of the LDPC codes and accelerate the falling speed of the BER curve. The present invention also provides a method for generating such an encoder/decoder.

In order to solve the foregoing technical problem, the present invention offers an encoder based on irregular low density parity check codes, which includes an encoding operation module, and is characterized in that it also includes basic matrix storage module, wherein:

Said basic matrix storage module is used to store the M×(N−M) block A corresponding to the information bit and the M×M block B corresponding to the basic bit. In said basic matrix, for all cycles with length of 4 in the basic matrix Hb, any element of i, j, k and l constituting the cycle in anti-clockwise or clockwise always satisfies the inequality: (i−j+k−l) mod z≠0, where mod is modular operation, and z is the extension factor.

Said encoding operation module is used to perform the encoding operation of obtaining N×z bit code from the (N−M)×z bit original source data based on said basic matrix.

Furthermore, the above-mentioned encoder may also have the following characteristic: it still includes the extension module to extend said basic matrix according to the extension factor and the basic permutation matrix to obtain (M×z)×(N×z) parity check matrix of the low density parity check codes, and said encoding operation module perform encoding based on the parity check matrix obtained from the extension of said basic matrix.

Furthermore, the above-mentioned encoder may also have the following characteristic: said basic matrix storage module stores several basic matrices, and each of them corresponds to the low density parity check codes required by specific bit rate with certain code length; alternatively, said stored basic matrix is the unique basic matrix of the low density parity check codes of specific bit rate and several code lengths, and the encoder also includes a modification module to read the basic matrices according to the code length of the present data stream, modify their non-negative values and forward them to the subsequent processing module.

Furthermore, the above-mentioned encoder may apply the above-mentioned basic matrix of the present invention, therefore bears all characteristics of the basic matrix.

In order to solve the foregoing technical problem, the present invention offers a decoder based on irregular low density parity check codes, which includes a decoding operation module, and is characterized in that it also includes basic matrix storage module, wherein:

Said basic matrix storage module is used to store the M×(N−M) block A corresponding to the information bit and the M×M block B corresponding to the check bit. In said basic matrix, for all cycles with length of 4 in the basic matrix Hb, any element of i, j, k and l constituting the cycle in anti-clockwise or clockwise always satisfies the inequality: (i−j+k−l) mod z≠0, where mod is modular operation, and z is the extension factor.

Said decoding operation module is used to correct and output the input interfered codeword bits based on said basic matrix.

Furthermore, the above-mentioned decoder may also have the following characteristic: it still includes the extension module to extend said basic matrix based on the extension factor and the basic permutation matrix to obtain (M×z)×(N×z) parity check matrix of the low density parity check codes, and said decoding operation module performs decoding based on the parity check matrix obtained from the extension of said basic matrix.

Furthermore, the above-mentioned encoder may also have the following characteristic: said basic matrix storage module stores several basic matrices, and each of them corresponds to the low density parity check codes required by specific code rate with certain code length; alternatively, said stored basic matrix is the unique basic matrix of the low density parity check codes of specific code rate and several code lengths, and the encoder also includes a modification module to read the basic matrices according to the code length of the present data stream, modify their non-negative values and forward them to the subsequent processing module.

Furthermore, the above-mentioned decoder may apply the above-mentioned basic matrices of the present invention, therefore bears all characteristics of the basic matrices.

In order to solve the foregoing technical problem, the present invention offers a generation method of encoder/decoder based on irregular low density parity check codes, which includes the following steps:

(a) According to the requirement of code rate and code length, the number of rows M and the number of columns N of the basic matrix to be constructed is determined, and, the row weight vector and column weight vector of the basic matrix Hb is determined according to the requirement of degree distribution;

(b) An irregular original basic matrix Hb' which consists of M×(N−M) block A corresponding to the information bits and M×M block B corresponding to the check bits is constructed;

(c) Positions corresponding to element '1' of the original basic matrix Hb' are filled with values selected from set {0, 1, 2, . . . , z−1} i to obtain the basic matrix Hb, and for all cycles in Hb with length of 4, any element of i, j, k and l constituting the cycle in anti-clockwise or clockwise always satisfies the inequality: (i−j+k−1) mod z≠0, where mod is modular operation, and z is the extension factor;

(d) Said basic matrix obtained according to steps (a) to steps (c) is stored and an encoding/decoding module for encoding/decoding operation is constructed to form encoder/decoder.

Furthermore, said steps (a) to (c) may apply the generation method of the above-mentioned basic matrix of the present invention, therefore having all characteristics of the above generation method.

Furthermore, the above-mentioned generation method of the above-mentioned encoder/decoder may also have the following characteristic: based on each code length of specific code rate, the method constructs a corresponding basic matrix respectively by the method of step (a) to (c), and stores it in said basic matrix storage module.

Furthermore, the above-mentioned generation method of the encoder/decoder may also have the following characteristic: in said step (d), what is stored in said basic matrix storage module is the unique basic matrix of the low density parity check codes of specific code rate with several code lengths, and the basic matrix is constructed from the extension factor corresponding to the maximum code length, and a modification module is configured to the encoder/decoder to modify the non-negative values of the basic matrix according to the code length of the present data stream and forward them to the subsequent processing module.

The method of the present invention lays stress on girth of LDPC codes to design good encoder and decoder of LDPC codes. But the possible combination patterns of the basic matrix is huge, and no feasible method for constructing a parity check matrix with girth as large as possible and the number of shortest cycles as few as possible is offered, no basic matrix meeting the above requirements can be obtained by prior art. The present invention offers a generation method of basic matrix to create such basic matrix meeting the above requirements, namely, LDPC parity check matrix created by the basic matrix has higher girth and the fewest number of the shortest cycles on the lighter node as possible, effectively eliminates error-floor phenomenon of the LDPC codes and accelerates the falling speed of the BER curve. Furthermore, the basic matrix of the present invention has the foregoing characteristics for variable code length under the condition of specific code rate, therefore, dramatically decreases the storage space and is quite universal.

EMBODIMENT OF THE PRESENT INVENTION

LDPC code is a special kind of linear block codes. In communication, M check bits are needed for each sent code word with block length of N bits to guarantee certain correction capability, each code word needs to meet the requirement of $Hx^T=0^T$, wherein H is an M×N dimensional parity check matrix in binary field. All operations are performed in binary field GF(2), and addition and subtraction herein are XOR operation, and multiplication AND operation.

Direct encoding method of the system block code is: a code word x is divided into N−M information bit s and M check bit c, correspondingly, the M×N parity check matrix H is divided into two blocks with sizes of M×(N−M) and M×M corresponding to the information bit and the check bit respectively, namely H=[A|B]. According to H×x=0, we have:

$$[A\,|\,B] \times \begin{bmatrix} s \\ c \end{bmatrix} = 0$$

Then we have A×s+B×c=0, and further c=B−1As is obtained. When block B applies a special matrix structure, such as strictly lower triangular structure (half random matrix), double lower triangular structure, etc., B−1 has a very simple form, the check bit part c in the code word can be directly calculated according to the above formula, and the encoder can be guaranteed to have linear complexity.

Richardson linear-time encoding algorithm can also be applied: the parity check matrix H has quasi lower triangular structure, suppose H has the following form:

$$H = \begin{pmatrix} A & B & T \\ C & D & E \end{pmatrix}$$

The encoded code word is supposed x=(s, $p_1$, $p_2$), wherein s is the system bit part of the encoded code word, $p_1$ and $p_2$ are the check bit part of the code word, the length of $p_1$ is g and the length of $p_2$ is (m−g). In the above formula, the dimension of A is (m−g)×(n−m), B (m−g)×g, T (m−g)×(m−g), C g×(n−m), D g×g, and E g−(m−g). All these matrices are sparse matrices, and T is lower triangular matrix with all the diagonal elements being 1. The check bit part can be obtained from the following formula:

$$p_1^T = -\phi^{-1}(-ET^{-1}A+C)s^T$$

$$p_2^T = -T^{-1}(As^T+Bp_1^T) \text{ wherein } \phi = -ET^{-1}B+D.$$

Therefore, the encoder of LDPC codes designed by the present invention can be uniquely created by LDPC parity check matrix H, which actually determines not only the performance of the LDPC code decoder but also the complexity, storage space and processing delay of the encoder and decoder of LDPC code. So it is the most important to search for the appropriate parity check matrix structure of LDPC codes.

In the concrete implementation, the encoding from the (N−M)×z bits row data to the N×z-bit code word can be performed by the foregoing direct method, Richardson method or other operation method. In fact, the encoder uses software or hardware to implement the multiplication and addition operations of the sparse matrix in the formula. For LDPC code based on the unit matrix and its cyclic shift matrix, the multiplication operation of the sparse matrix may be performed by several cyclic shift registers with z bits (z is the extension factor) and several adders with z bits, and the addition operation of the sparse matrix may be performed by the foregoing several adders with z bits, and the cyclic shift registers with several z bits and adders with several z bits constitute a LDPC encoder implemented by a hardware circuit.

The graph presentation of the LDPC parity check matrix is a bipartite graph, which has one-to-one correspondence with the check matrix, a M*N parity check matrix H defines the restriction for each code word with N bits meeting M parity check sets. A bipartite graph includes N variable nodes and M parity check nodes. When the $m^{th}$ check relates to the $n^{th}$ bit, namely the $m^{th}$ row and the $n^{th}$ column element in H equals 1 (Hm,n=1), there is a connecting line connects the check node m and the variable node n. There is no connection between nodes of any same kind in the bipartite graph, and the number of edges in the bipartite graph equals to the number of non-zero elements in the check matrix.

Figure 2:
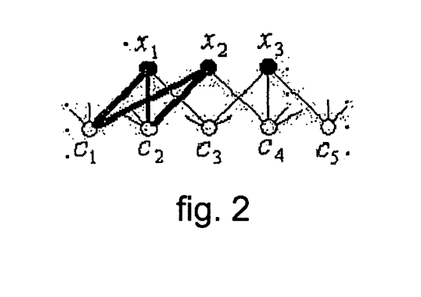
FIG. 2 is an illustration of the cycle with length of 4 in the bipartite graph.
Figure 3:
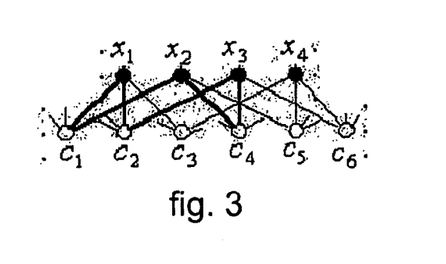
FIG. 3 is an illustration of the cycle with length of 6 in the bipartite graph.
Figure 4:
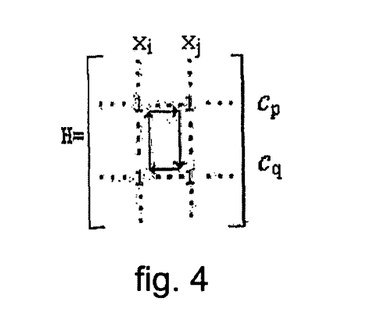
FIG. 4 is an illustration of the cycle with length of 4 in the check matrix.
Figure 5:
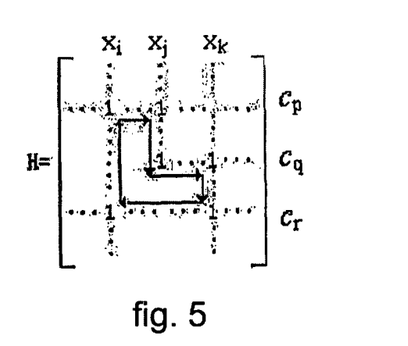
FIG. 5 is an illustration of the cycle with length of 6 in the check matrix.

The concept of girth is used to quantitatively describe short cycles in bipartite graphs. In graph theory, girth of a bipartite graph indicates the length of the shortest cycle in the graph, for instance, some bipartite graph has cycles with length of 6, 8, 10, 12 and more, then the girth of the bipartite graph is 6; girth of a node is the length of the shortest cycle passing the node. For example, the solid line in thickened black in FIG. 2 is a cycle with length of 4 composed by the information bits x1 and x2 and the check bits c1 and c2, which means x1 and x2 relate with each other via the cycle with length of 4. The solid line in thickened black in FIG. 3 is a cycle with length of 6 composed by the information bits x1, x2 and x3 and the check bits c1, c2 and c3, which means x1, x2 and x3 relate with each other via the cycle with length of 6. FIG. 4 and FIG. 5 offers the general forms of cycles with length of 4 and 6 respectively in the LDPC parity check matrix.

Information transmission decoding algorithm of LDPC codes assumes the variable nodes are independent with each other, yet the existence of the cycle inevitably breaks the assumption, which will obviously decrease the decoding performance. In fact, the longer the shortest cycle of the bipartite graph corresponding to LDPC parity check matrix is, namely, the larger the girth value, the less positive feedback information of the information sent from the variable node is transferred to the node itself and the better is the decoding performance. Therefore, the principle of constructing LDPC parity check matrix in the present invention is as follows: firstly, the length of the shortest cycle (girth) of the selected check matrix should be as large as possible; secondly, for the check matrix with the same girth, the number of shortest cycles of the selected check matrix should be as few as possible.

The parity check matrix of LDPC codes is assumed to be a (M×z)×(N×z) matrix composed of M×N block matrices, each block matrix is a z×z basic permutation matrix with a different power number, and when the basic permutation matrices are the unit matrices, they are cyclic shift matrices of the unit matrices (the default is right shift in this document). Each block matrix can be uniquely identified via the power number j, the power number of the unit matrix can be represented as 0, and null matrix is generally represented as −1. Therefore, if each block matrix of H is replaced by its power number, a M×N power matrix Hb can be obtained. Here, Hb is defined as the basic matrix of H, and H is called the extension matrix of Hb. In practical encoding, z=length of code/the number of rows N in the basic matrix, called the extension factor.

For example, matrix $$H = \begin{bmatrix} 1 & 0 & 0 & 0 & 1 & 0 & 1 & 0 & 0 & 0 & 0 & 0 \\ 0 & 1 & 0 & 0 & 0 & 1 & 0 & 1 & 0 & 0 & 0 & 0 \\ 0 & 0 & 1 & 1 & 0 & 0 & 0 & 0 & 1 & 0 & 0 & 0 \\ 0 & 0 & 1 & 0 & 1 & 0 & 0 & 0 & 1 & 0 & 1 & 0 \\ 1 & 0 & 0 & 0 & 0 & 1 & 1 & 0 & 0 & 0 & 0 & 1 \\ 0 & 1 & 0 & 1 & 0 & 0 & 0 & 1 & 0 & 1 & 0 & 0 \end{bmatrix}$$

can be obtained by extending the following parameter z and a 2×4 basic matrix Hb:

$$z = 3, \text{ and } H_b = \begin{bmatrix} 0 & 1 & 0 & -1 \\ 2 & 1 & 2 & 1 \end{bmatrix}$$

Therefore, the LDPC code encoder of the present invention can be thought to be uniquely created by the basic matrix Hb, the extension factor z and the selected basic permutation matrix. According to the definition of the foregoing basic matrix, it can be seen that the basic matrix and the parity check matrix are essentially the same if the extension factor (an integer z larger than 1) is given.

When constructing the basic matrix Hb, firstly an original basic matrix Hb' is constructed, and elements of the original basic matrix are only made up of 0 and 1, and the matrix reflects important characteristics such as the degree distribution, code rate of LDPC codes to be constructed. Appropriate values are selected from set {0, 1, 2, . . . , z−1} to fill all positions corresponding to element '1' in the original basic matrix, and elements '0' are replaced by '−1', then the corresponding basic matrix can be obtained, wherein z is the extension factor for the corresponding code length.

There is relationship between girth of the check matrix H and the basic matrix Hb, and the following conclusions can be obtained by validation of mathematical reasoning and computational simulation (referred to the relative content of Chinese patent application 200410009746.5 by the same inventor for detailed analyzing process):

The sufficient and necessary condition for girth of LDPC parity check matrix ≥6 is: in its basic matrix, for all cycles with length of 4, any element of i, j, k and l constituting the cycle in anti-clockwise or clockwise (the effect is equivalent for clockwise order and anti-clockwise order) always satisfies: (i−j+k−l) mod z≠0, wherein mod is modular operation, and z is the extension factor, an even number;

The sufficient and necessary condition for girth of LDPC parity check matrix ≥8 is: in its basic matrix, for all cycles with length of 4, any element of i, j, k and l constituting the cycle in anti-clockwise or clockwise always satisfies: (i−j+k−l) mod z≠0; and for all cycles with length of 6, any element of i, j, k, l, m and n constituting the cycle in anti-clockwise or clockwise always satisfies: (i−j+k−l+m−n) mod z≠0.

The sufficient and necessary condition for girth of LDPC parity check matrix ≥10 is: in its basic matrix, for all cycles with length of 4, any element of i, j, k and l constituting the cycle in anti-clockwise or clockwise always satisfies: (i−j+k−l) mod z≠0; for all cycles with length of 6, any element of i, j, k, l, m and n constituting the cycle in anti-clockwise or clockwise always satisfies: (i−j+k−l+m−n) mod z≠0; and for all cycles with length of 8, any element of i, j, k, I, m, n, s and t constituting the cycle in anti-clockwise or clockwise always satisfies: (i−j+k−l+m−n+s−t) mod z≠0.

The performance of the encoder can be hardly improved by increasing girth when girth≥10, therefore only elimination of short cycles with length of 4, 6 and 8 will be considered in the present invention.

Based on the foregoing conclusions, when constructing the basic matrix of LDPC parity check matrix, the foregoing inequality can be used as the constraint condition for selecting element value to make the parity check matrix obtained by extending the basic matrix have the expected girth value. It also can be used to check the created basic matrix to tell whether the parity check matrix obtained by the extension has the expected girth value.

If one basic matrix does not applies to different extension factors, said LDPC code encoder/decoder need to store one basic matrix for every different code length, then a large number of basic matrices need to be stored when there are plenty of code lengths, which will occupy a huge storage space or complicate the hardware circuit. Therefore, from practicability, for several different code lengths with the same code rate, the embodiment uses the same basic matrix, which is usually created corresponding to the longest code and modified at specific code length to make the created codec suitable for variable code length. Not being limited to this characteristic, the present invention also applies to the case that each code length applies a basic matrix.

The correction uses the extension factor of other bit length to correct the non-negative elements in the basic matrix Hb, and the corrected element value should be less than the value of the extension factor under the code length. The correction algorithm can be mod, scale+floor or scale+round. Suppose Pi, j is the non-negative element on the $i^{th}$ row and the $j^{th}$ column of the basic matrix, and P′i, j is the corrected elements, there is:

For mod algorithm:

$$P'_{ij} \equiv P_{ij} \bmod \frac{n}{N}$$

For scale+floor algorithm:

$$P'_{ij} = \left[ P_{ij} \times \frac{n}{2304} \right]$$

For scale+round algorithm:

$$P'_{ij} = \text{Round}\left(P_{ij} \times \frac{n}{2304}\right)$$

Wherein N is the number of columns of the basic matrix, and n is the code length of the low density parity check codes for the parity check matrix. Mod is mod operation, [ ] is floor operation, and Round is round-off operation. Here, the biggest length of code is supposed to be 2304.

For example, for LDPC codes with code length 1152, suppose some non-negative element of the basic matrix is 93, then the corrected result is:

For mod algorithm:

$$93 \bmod \frac{1152}{24} = 93 \bmod 48 = 45$$

For scale+floor algorithm:

$$\left[ 93 \times \frac{1152}{2304} \right] = [46.5] = 46$$

For scale+round algorithm:

$$\text{Round}\left(93 \times \frac{1152}{2304}\right) = \text{Round}(46.5) = 47$$

Figure 6:
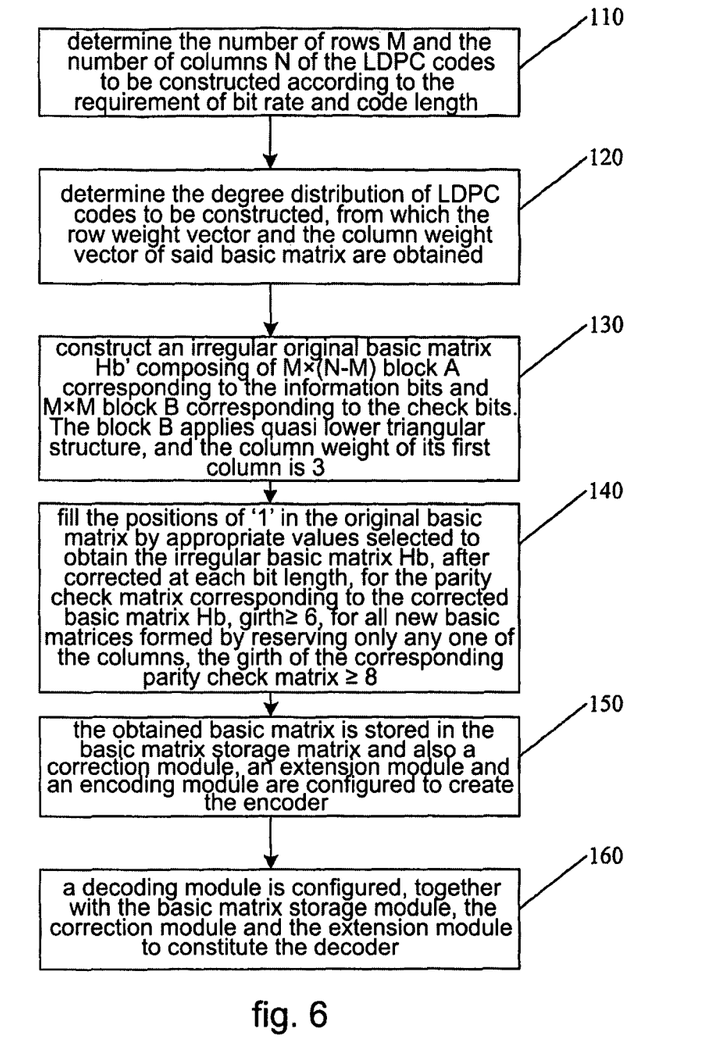
FIG. 6 is a flow chart of the generation method of the encoder according to an embodiment of the present invention.

Based on the above analysis, as shown in FIG. 6, the generation method of the basic matrix of the LDPC codes with variable code length and its encoder/decoder offered by the embodiment is as follows:

In step 110, according to the requirement of code rate and code length, the number of rows M and the number of columns N of the LDPC codes to be constructed are determined;

Different number of check bits is prescribed for different code rates, and the embodiment will considers three code rates 1/2, 2/3 and 3/4, applying check bits 12, 8 and 6 respectively, with the correspondingly number of rows M of the basic matrix 12, 8 and 6. When determining the number of columns, the requirement that the code length and the extension factor are even should be considered. Suppose there are totally 19 kinds of code lengths (bits), 576, 672, 768, 864, 960 . . . 2304, respectively, with the interval between the neighbor code lengths 96 bits. In order to simultaneously consider decoding performance and the requirements of storage space, let the basic matrices under the three code rates in the embodiment be 24 columns (which can also be 12 columns, 48 columns, etc.). Then the extension factor z of each code length can be calculated respectively 24, 28, 32, 36, 40 . . . 96, with an interval of 4. zmin=24 is the extension factor of the shortest code; and zmax=96 is that of the longest one.

In step 120, the degree distribution of LDPC codes to be constructed is determined, from which the row weight vector and the column weight vector of said basic matrix are obtained;

From the viewpoint of optimum performance, the present invention applies irregular LDPC codes, and the degree distribution can be eventually selected from the calculation results by fully considering the signal-noise-ratio threshold, the iterative convergence speed and the complexity of the algorithm.

For the irregular LDPC code based on unit matrix and its cyclic shift matrix, there is always a strict restraint on the size of its basic matrix, due to the difficulty of storage, representation and calculation of an over-sized basic matrix. Considering that the size of the basic matrix is limited (e.g. in IEEE802.16e, the number of columns of all basic matrices is 24), which will in turn limit the biggest column weight of the parity check matrix. Thus, generally, the biggest column weight of the parity check matrix should be as big as possible, based on the premise that it will not violate the design principle. For example, if the size of the basic matrix with code rate of 1/2 is set to be 12×24, choose 12 as the maximum column weight of the basic matrix; if the size of the basic matrix with code rate of 2/3 is set to be 8×24, choose 8 as the maximum column weight of the basic matrix; and if the size of the basic matrix with code rate of 3/4 is set to be 6×24, choose 6 as the maximum column weight of the basic matrix. The biggest column weight, under the condition of the design requirement, ensures best performance of the designed LDPC codes has the best performance, without obviously increasing the average row weight which determines the complexity of the decoding algorithm in logarithm domain, so big column weight can contributes little to the complexity.

In step 130, the row and column weight vectors are used to construct an irregular original basic matrix Hb' composing of M×(N−M) block A corresponding to the information bits and M×M block B corresponding to the check bits. The block B applies quasi lower triangular structure, the column weight of its first column is 3, and the other part is a double lower triangular structure, but the present invention is not limited to this;

In order to make the filled basic matrix easily satisfy the foregoing inequality related to girth, it would be better to choose the largest girth for the original basic matrix from the possible matrices meeting the row and column weight vectors. For this reason, bit filling method can be applied to construct the original basic matrix, and in the process of construction, the number of the shortest cycles is calculated and made as few as possible, which is beneficial to obtain a check matrix with high girth. When the matrix is not big, it can be picked up from the possible combinations of permutation.

The block B applies quasi lower triangular structure to make the structure of the constructed parity check matrix in accordance with linear-time encoding, decrease the encoding complexity.

Figure 7:
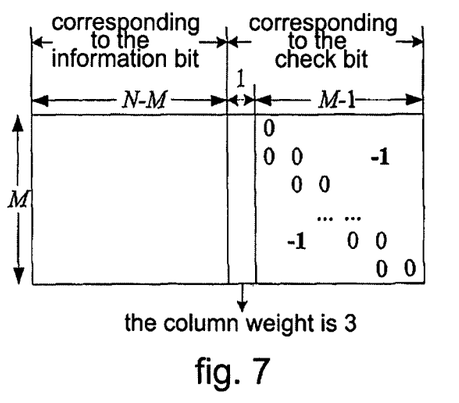
FIG. 7 is the structure illustration of the basic matrix defined by the present invention.

In step 140, the positions of '1' in the original basic matrix are filled with appropriate values from set $\{0, 1, 2, \ldots, z-1\}$ to obtain the irregular basic matrix Hb (its format is shown as FIG. 7), which should meet: condition 1, at each bit length, for the parity check matrix corresponding to the corrected basic matrix Hb, girth is ≥6, and condition 2, if the number of heaviest columns in the basic matrix Hb is r, for all new basic matrices formed by deleting any r−1 columns and corrected at each code length, the girth of the corresponding parity check matrix is ≥8. The above given inequality can be used to check whether the girth meets the requirement or not.

The embodiment applies the following specific filling method to realize the above-mentioned restraint:

1) It is supposed that there are r heaviest columns in the original basic matrix. Firstly, all the r heaviest columns are removed from the original basic matrix Hb', and values from set $\{0, 1, 2 \ldots z-1\}$ are selected to fill in the position of "1" in the matrix, leaving the unfilled positions blank. The filling step is done column by column in this embodiment. When filling a position, the value is firstly selected according to girth≥10 for the corresponding parity check matrix; if there is no such value, then it is selected according to girth≥10 for the corresponding parity check matrix. Additionally, if there are several values meeting the same restraint condition for one position, one value is chosen randomly for filling.

When filling a position, the requirement of girth≥10 for the corresponding parity check matrix is: after a value is selected, for every cycle with length of 4 passing the position, any element of i, j, k and l constituting the cycle in anti-clockwise or clockwise always satisfies: $(i-j+k-l) \mod z \neq 0$; for every cycle with length of 6 passing the position, any elements i, j, k, l, m and n constituting the cycle in anti-clockwise or clockwise always satisfies: $(i-j+k-l+m-n) \mod z \neq 0$; and for all cycles with length of 8 passing the position, any elements i, j, k, l, m, n, s and t constituting the cycle in anti-clockwise or clockwise always satisfies: $(i-j+k-l+m-n+s-t) \mod z \neq 0$.

When filling a position, the requirement of girth ≥8 for the corresponding LDPC matrix of the matrix is: after a value is selected, for every cycle with length of 4 passing the position, any element of i, j, k and l constituting the cycle in anti-clockwise or clockwise always satisfies: $(i-j+k-l) \mod z \neq 0$; for every cycle with length of 6 passing the position, any elements i, j, k, l, m and n constituting the cycle in anti-clockwise or clockwise always satisfies: $(i-j+k-l+m-n) \mod z \neq 0$.

2) The matrix, after the positions are filled, is corrected to be basic matrices according to all other code lengths corresponding to the code rate, for each basic matrix obtained by correction (it works as long as a correction method can make the corrected basic matrix meet the requirement, yet the same correction method should be applied in each filling), it is checked whether it satisfies girth≥8 for its corresponding parity check matrix; if it is, the next step is performed, otherwise, return to step 1) to select another value. This ensures that all the extended parity check matrices obtained by direct extension or correction of the basic matrix at all code lengths meet the requirement of girth;

3) After filling the matrix removed the heaviest column, the $n^{th}$ heaviest column is added and the remaining r−1 heaviest columns are removed (n=1, 2 . . . r) to construct a new basic matrix. A value is selected to fill the positions of '1' in this heaviest column of said new basic matrix according to the same methods and requirements of step 1) and 2). After selecting the value, the foregoing r−1 heaviest columns (may only add into the filled heaviest columns) are added to constitute another new basic matrix. After the matrix is corrected corresponding to each code length, it is checked whether it satisfies girth ≥6 for its corresponding parity check matrix; if it is, the next position is filled, otherwise, another value is selected and checked again for the position;

When filling a position, the requirement of girth≥6 for the corresponding parity check matrix of the matrix is: after filling, for every cycle with length of 4 passing the position, any element of i, j, k and l constituting the cycle in anti-clockwise or clockwise always satisfies: (i−j+k−l) mod z≠0.

4) After a heaviest column is filled, the next heaviest column is filled according to the method of the previous step until all the r heaviest columns are filled, then the basic matrix is obtained, which satisfies girth≥6 for the corresponding parity check matrix at all code lengths and meets the above-mentioned second condition.

The meaning of setting the foregoing second condition and achieving the constraint condition by the foregoing step 3) is that, under the condition of ensuring the value of girth, it further decreases the number of the shortest cycles, especially of those passing the nodes with light weight, therefore improves significantly the performance of encoding/decoding since the light nodes converge later.

In the case that the above-mentioned second condition may not be met when the basic matrix is relatively small, the embodiment also brings up the third condition (the first condition must be met) to improve the performance as far as possible: the number of the heaviest columns in the basic matrix Hb is supposed to be r, and girth is ≥8 for parity check matrix corresponding to all new basic matrices formed by deleting any r−1 columns herein and all the columns with weight of 3 and corrected according to each code length.

Specifically when filling in step 3), when filling the new basic matrix with the $n^{th}$ heaviest column added and the remaining r−1 heaviest columns removed, if all selectable values can not meet the requirement of girth ≥8 for its corresponding parity check matrix after correction at each code length, another new basic matrix is formed by further removing all the columns with weight of 3. A value is selected, which can make girth≥8 for the parity check matrix correspond to the filled new basic matrix after correction at each code length. Then other filled heaviest columns are added for validation. This condition is looser than condition 2. Namely, the embodiment requires that the constructed basic matrix must meet the first condition, and besides, it is better that the second condition is met; otherwise, a matrix meeting the third condition is applied.

If just a basic matrix corresponding to a specific code length is constructed, which equals to a special case of the above embodiment with one code length, then it merely requires that removing the step of correction and check for the basic matrix when selecting a value, which will not be repeated here.

If all the above requirements can not be met when selecting values, the size of the basic matrix and the initial value should be adjusted.

For LDPC code with code rate of 1/2, 2/3 and 3/4, three basic matrices (mb×nb) meeting the above requirements are provided, wherein:

the basic matrix with code rate of 1/2 is as follows: the size is 12×24 with the first row indicating column index:

| 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 |
|---|---|---|---|---|---|---|---|---|---|---|---|---|---|---|---|---|---|---|---|---|---|---|---|
| 93 | −1 | −1 | 30 | −1 | 25 | −1 | 56 | −1 | 77 | −1 | 65 | 0 | 0 | −1 | −1 | −1 | −1 | −1 | −1 | −1 | −1 | −1 | −1 |
| −1 | 87 | −1 | 88 | 5 | −1 | −1 | 31 | −1 | −1 | 70 | 32 | −1 | 0 | 0 | −1 | −1 | −1 | −1 | −1 | −1 | −1 | −1 | −1 |
| −1 | −1 | −1 | 10 | −1 | 9 | −1 | 20 | 86 | −1 | −1 | 37 | −1 | −1 | 0 | 0 | −1 | −1 | −1 | −1 | −1 | −1 | −1 | −1 |
| 45 | −1 | −1 | 92 | −1 | −1 | 90 | 13 | −1 | −1 | 9 | 1 | −1 | −1 | −1 | 0 | 0 | −1 | −1 | −1 | −1 | −1 | −1 | −1 |
| −1 | −1 | −1 | 26 | 2 | −1 | −1 | 95 | 75 | −1 | −1 | 86 | −1 | −1 | −1 | −1 | 0 | 0 | −1 | −1 | −1 | −1 | −1 | −1 |
| −1 | 66 | 5 | 53 | −1 | −1 | −1 | 49 | −1 | −1 | 25 | 36 | −1 | −1 | −1 | −1 | −1 | 0 | 0 | −1 | −1 | −1 | −1 | −1 |
| −1 | −1 | −1 | 25 | −1 | 39 | 93 | 30 | −1 | −1 | −1 | 91 | −1 | −1 | −1 | −1 | −1 | −1 | 0 | 0 | −1 | −1 | −1 | −1 |
| −1 | −1 | −1 | 52 | 60 | −1 | −1 | 4 | 15 | 82 | −1 | 73 | −1 | −1 | −1 | −1 | −1 | −1 | −1 | 0 | 0 | −1 | −1 | −1 |
| 21 | −1 | 22 | 58 | −1 | −1 | −1 | 42 | −1 | −1 | −1 | 38 | −1 | −1 | −1 | −1 | −1 | −1 | −1 | −1 | 0 | 0 | −1 | −1 |
| −1 | 23 | −1 | 19 | −1 | −1 | 82 | 94 | −1 | 86 | −1 | 48 | −1 | −1 | −1 | −1 | −1 | −1 | −1 | −1 | −1 | 0 | 0 | −1 |
| −1 | −1 | 0 | 75 | 26 | 52 | −1 | 2 | −1 | −1 | −1 | 28 | −1 | −1 | −1 | −1 | −1 | −1 | −1 | −1 | −1 | −1 | 0 | 0 |
| −1 | −1 | −1 | 69 | −1 | −1 | −1 | 39 | 62 | −1 | 67 | 80 | 0 | −1 | −1 | −1 | −1 | −1 | −1 | −1 | −1 | −1 | −1 | 0 |

It can be seen that its right half part applies double-diagonally lower triangular structure. Where '−1' represents zero matrix, column weight of the elements in one column represents the number of non-negative elements in the column. After the basic matrix is corrected and extended, for all code lengths, the girth of the created parity check matrix is at least 6.

The column weight distribution of the basic matrix is (the first column is column index):

| 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 |
|---|---|---|---|---|---|---|---|---|---|---|---|---|---|---|---|---|---|---|---|---|---|---|---|
| 3 | 3 | 3 | 12 | 4 | 4 | 3 | 12 | 4 | 3 | 3 | 12 | 3 | 2 | 2 | 2 | 2 | 2 | 2 | 2 | 2 | 2 | 2 | 2 |

Its biggest column weight is 12, and the number of heaviest columns is 3, i.e., the $4^{th}$, $8^{th}$ and $12^{th}$ columns respectively. And three types of matrices can be obtained by deleting any 2 columns herein. For example, the result of deleting the $8^{th}$ and $12^{th}$ columns herein and leaving the $4^{th}$ column is as follows:

| 1 | 2 | 3 | 4 | 5 | 6 | 7 | 8 | 9 | 10 | 11 | 12 | 13 | 14 | 15 | 16 | 17 | 18 | 19 | 20 | 21 | 22 |
|---|---|---|---|---|---|---|---|---|---|---|---|---|---|---|---|---|---|---|---|---|---|
| 93 | -1 | -1 | 30 | -1 | 25 | -1 | -1 | 77 | -1 | 0 | 0 | -1 | -1 | -1 | -1 | -1 | -1 | -1 | -1 | -1 | -1 |
| -1 | 87 | -1 | 88 | 5 | -1 | -1 | -1 | -1 | 70 | -1 | 0 | 0 | -1 | -1 | -1 | -1 | -1 | -1 | -1 | -1 | -1 |
| -1 | -1 | -1 | 10 | -1 | 9 | -1 | 86 | -1 | -1 | -1 | -1 | 0 | 0 | -1 | -1 | -1 | -1 | -1 | -1 | -1 | -1 |
| 45 | -1 | -1 | 92 | -1 | -1 | 90 | -1 | -1 | 9 | -1 | -1 | -1 | 0 | 0 | -1 | -1 | -1 | -1 | -1 | -1 | -1 |
| -1 | -1 | -1 | 26 | 2 | -1 | -1 | 75 | -1 | -1 | -1 | -1 | -1 | -1 | 0 | 0 | -1 | -1 | -1 | -1 | -1 | -1 |
| -1 | 66 | 5 | 53 | -1 | -1 | -1 | -1 | -1 | 36 | -1 | -1 | -1 | -1 | -1 | 0 | 0 | -1 | -1 | -1 | -1 | -1 |
| -1 | -1 | -1 | 25 | -1 | 39 | 93 | -1 | -1 | -1 | -1 | -1 | -1 | -1 | -1 | -1 | 0 | 0 | -1 | -1 | -1 | -1 |
| -1 | -1 | -1 | 52 | 60 | -1 | -1 | 15 | 82 | -1 | -1 | -1 | -1 | -1 | -1 | -1 | -1 | 0 | 0 | -1 | -1 | -1 |
| 21 | -1 | 22 | 58 | -1 | -1 | -1 | -1 | -1 | -1 | -1 | -1 | -1 | -1 | -1 | -1 | -1 | -1 | 0 | 0 | -1 | -1 |
| -1 | 23 | -1 | 19 | -1 | -1 | 82 | -1 | 86 | -1 | -1 | -1 | -1 | -1 | -1 | -1 | -1 | -1 | -1 | 0 | 0 | -1 |
| -1 | -1 | 0 | 75 | 26 | 52 | -1 | -1 | -1 | -1 | -1 | -1 | -1 | -1 | -1 | -1 | -1 | -1 | -1 | -1 | 0 | 0 |
| -1 | -1 | -1 | 69 | -1 | -1 | -1 | 62 | -1 | 67 | 0 | -1 | -1 | -1 | -1 | -1 | -1 | -1 | -1 | -1 | -1 | 0 |

The other two types of matrix can be obtained by the same method, and it can be validated that the girth of the parity check matrix of each code length created by the three matrices as the basic matrix is 10 or 8.

It is supposed that the second condition can not be met, when validating the third condition, any 2 columns with the biggest column weight and the columns with weight of 3 of the basic matrix with code rate of 1/2 are deleted. For example, the result of deleting the 8th and 12th column (leaving the 4th column) with the biggest column weight and the 13th column with column weight of 3 is:

| 1 | 2 | 3 | 4 | 5 | 6 | 7 | 8 | 9 | 10 | 11 | 12 | 13 | 14 | 15 | 16 | 17 | 18 | 19 | 20 | 21 |
|---|---|---|---|---|---|---|---|---|---|---|---|---|---|---|---|---|---|---|---|---|
| 93 | -1 | -1 | 30 | -1 | 25 | -1 | -1 | 77 | -1 | 0 | -1 | -1 | -1 | -1 | -1 | -1 | -1 | -1 | -1 | -1 |
| -1 | 87 | -1 | 88 | 5 | -1 | -1 | -1 | -1 | 70 | 0 | 0 | -1 | -1 | -1 | -1 | -1 | -1 | -1 | -1 | -1 |
| -1 | -1 | -1 | 10 | -1 | 9 | -1 | 86 | -1 | -1 | -1 | 0 | 0 | -1 | -1 | -1 | -1 | -1 | -1 | -1 | -1 |
| 45 | -1 | -1 | 92 | -1 | -1 | 90 | -1 | -1 | 9 | -1 | -1 | 0 | 0 | -1 | -1 | -1 | -1 | -1 | -1 | -1 |
| -1 | -1 | -1 | 26 | 2 | -1 | -1 | 75 | -1 | -1 | -1 | -1 | -1 | 0 | 0 | -1 | -1 | -1 | -1 | -1 | -1 |
| -1 | 66 | 5 | 53 | -1 | -1 | -1 | -1 | -1 | -1 | -1 | -1 | -1 | -1 | 0 | 0 | -1 | -1 | -1 | -1 | -1 |
| -1 | -1 | -1 | 25 | -1 | 39 | 93 | -1 | -1 | -1 | -1 | -1 | -1 | -1 | -1 | 0 | 0 | -1 | -1 | -1 | -1 |
| -1 | -1 | -1 | 52 | 60 | -1 | -1 | 15 | 82 | -1 | -1 | -1 | -1 | -1 | -1 | -1 | 0 | 0 | -1 | -1 | -1 |
| 21 | -1 | 22 | 58 | -1 | -1 | -1 | -1 | -1 | -1 | -1 | -1 | -1 | -1 | -1 | -1 | -1 | 0 | 0 | -1 | -1 |
| -1 | 23 | -1 | 19 | -1 | 82 | -1 | 86 | -1 | -1 | -1 | -1 | -1 | -1 | -1 | -1 | -1 | -1 | 0 | 0 | -1 |
| -1 | -1 | 0 | 75 | 26 | 52 | -1 | -1 | -1 | -1 | -1 | -1 | -1 | -1 | -1 | -1 | -1 | -1 | -1 | 0 | 0 |
| -1 | -1 | -1 | 69 | -1 | -1 | 62 | -1 | 67 | -1 | -1 | -1 | -1 | -1 | -1 | -1 | -1 | -1 | -1 | -1 | 0 |

Then girths of the parity check matrices created by the above matrix at all code lengths are checked by applying inequality method. The girth obtained here is 10 or 8.

The basic matrix with code rate of 2/3 is as follows and the size is 8×24:

| 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 |
|---|---|---|---|---|---|---|---|---|---|---|---|---|---|---|---|---|---|---|---|---|---|---|---|
| 94 | -1 | -1 | 6 | -1 | 69 | 2 | 81 | -1 | -1 | 86 | -1 | -1 | -1 | 10 | 67 | 0 | 0 | -1 | -1 | -1 | -1 | -1 | -1 |
| -1 | 8 | -1 | -1 | 53 | -1 | 11 | 1 | 34 | -1 | -1 | 7 | 67 | -1 | 23 | 32 | -1 | 0 | 0 | -1 | -1 | -1 | -1 | -1 |
| 20 | -1 | -1 | -1 | -1 | 25 | 19 | 12 | -1 | 79 | 54 | -1 | -1 | 27 | 52 | 74 | -1 | -1 | 0 | 0 | -1 | -1 | -1 | -1 |
| -1 | -1 | 39 | 17 | 32 | -1 | 83 | 81 | -1 | -1 | -1 | -1 | 19 | -1 | 73 | 59 | 5 | -1 | -1 | 0 | 0 | -1 | -1 | -1 |
| 33 | 24 | -1 | -1 | -1 | 35 | 42 | 67 | -1 | 29 | 17 | -1 | -1 | -1 | 82 | 77 | -1 | -1 | -1 | -1 | 0 | 0 | -1 | -1 |
| -1 | -1 | -1 | 90 | -1 | -1 | 91 | 49 | 35 | -1 | -1 | 51 | 59 | 54 | 57 | 89 | -1 | -1 | -1 | -1 | -1 | 0 | 0 | -1 |
| 44 | -1 | 2 | -1 | 36 | -1 | 64 | 7 | 5 | 25 | -1 | -1 | -1 | -1 | 81 | 10 | -1 | -1 | -1 | -1 | -1 | -1 | 0 | 0 |
| -1 | 67 | -1 | -1 | -1 | 88 | 32 | 49 | -1 | -1 | 40 | 3 | -1 | 36 | 54 | 95 | 0 | -1 | -1 | -1 | -1 | -1 | -1 | 0 |

The basic matrix with code rate of 3/4 is as follows and the size is 12×24:

| 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 |
|---|---|---|---|---|---|---|---|---|---|---|---|---|---|---|---|---|---|---|---|---|---|---|---|
| 20 | -1 | 78 | -1 | 46 | 49 | 40 | -1 | 40 | 56 | -1 | 23 | 16 | 16 | 44 | -1 | -1 | 80 | 0 | 0 | -1 | -1 | -1 | -1 |
| 50 | 64 | -1 | 56 | 91 | 41 | -1 | 5 | -1 | 69 | 72 | -1 | 25 | 71 | -1 | 19 | 15 | -1 | -1 | 0 | 0 | -1 | -1 | -1 |
| -1 | 49 | 56 | 71 | -1 | 83 | 25 | -1 | 65 | 50 | 35 | 42 | -1 | -1 | 3 | 26 | -1 | 46 | -1 | -1 | 0 | 0 | -1 | -1 |
| 4 | -1 | -1 | 26 | 7 | -1 | 20 | 40 | -1 | -1 | 7 | 53 | 85 | 61 | 66 | -1 | 37 | 84 | 93 | -1 | -1 | 0 | 0 | -1 |
| 61 | 11 | 81 | -1 | -1 | 2 | 55 | 23 | 20 | -1 | 27 | -1 | 48 | -1 | 82 | 3 | 23 | -1 | -1 | -1 | -1 | -1 | 0 | 0 |
| -1 | 17 | 65 | 34 | 21 | -1 | -1 | 92 | 61 | 81 | -1 | 26 | -1 | 8 | -1 | 78 | 57 | 60 | 0 | -1 | -1 | -1 | -1 | 0 |

Its column weight distribution is (the first column is column index):

| 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 |
|---|---|---|---|---|---|---|---|---|----|----|----|----|----|----|----|----|----|----|----|----|----|----|----|
| 4 | 4 | 4 | 4 | 4 | 4 | 4 | 4 | 4 | 4  | 4  | 4  | 4  | 4  | 4  | 4  | 4  | 3  | 2  | 2  | 2  | 2  | 2  |

The biggest column weight of the matrix is 4, and the number of the heaviest columns is 12, so when one heaviest column remains, 12 types of matrix can be obtained, wherein the result of leaving the $1^{st}$ column and deleting other heaviest columns is:

| 1 | 2 | 3 | 4 | 5 | 6 | 7 |
|---|---|---|---|---|---|---|
| 20 | 0 | 0 | −1 | −1 | −1 | −1 |
| 50 | −1 | 0 | 0 | −1 | −1 | −1 |
| −1 | −1 | −1 | 0 | 0 | −1 | −1 |
| 4 | 93 | −1 | −1 | 0 | 0 | −1 |
| 61 | −1 | −1 | −1 | −1 | 0 | 0 |
| −1 | 0 | −1 | −1 | −1 | −1 | 0 |

By the same method, the other 11 types of matrix can be obtained. It can be validated that the girths of the parity check matrices with 19 code lengths created by the 12 types of matrix as the basic matrix are all 10.

If the second condition can not be met and the third condition should be validated, any 11 columns with biggest column weight and the columns with the column weight of 3 in the basic matrix with code rate of 3/4 are deleted. For example, the result of leaving the $1^{st}$ columns and deleting other heaviest columns and the $19^{th}$ column with column weight of 3 in the biggest columns is:

| 1 | 2 | 3 | 4 | 5 | 6 |
|---|---|---|---|---|---|
| 20 | 0 | −1 | −1 | −1 | −1 |
| 50 | 0 | 0 | −1 | −1 | −1 |
| −1 | −1 | 0 | 0 | −1 | −1 |
| 4 | −1 | −1 | 0 | 0 | −1 |
| 61 | −1 | −1 | −1 | 0 | 0 |
| −1 | −1 | −1 | −1 | −1 | 0 |

The girths corresponding to the parity check matrices with each code length created by the matrix as the basic matrix are 10 or 8.

It should be noted that the foregoing new basic matrix creating by deleting several columns is not the basic matrix used by the encoder/decoder, but is only used when validating whether the obtained basic matrix come up to the conditions.

Figure 8:
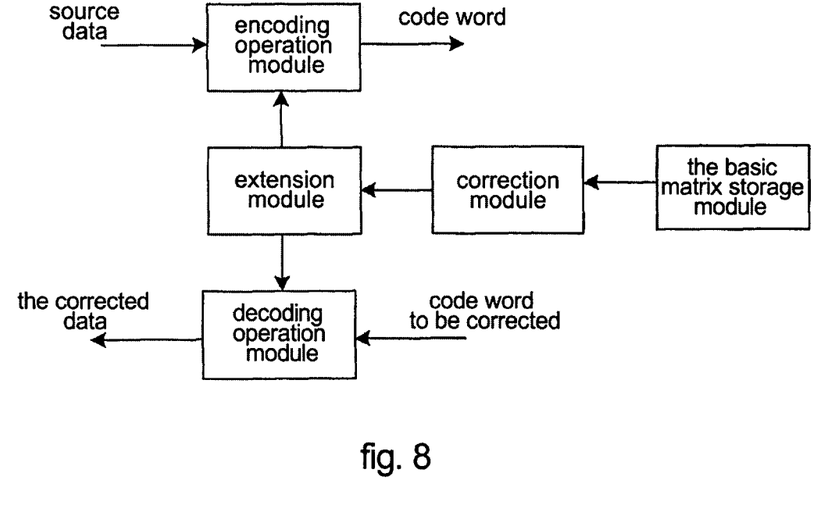
FIG. 8 is the structure block diagram of the codec according to an embodiment of the present invention.

In step 150, the obtained basic matrix is stored in the basic matrix storage matrix and also a correction module, an extension module and an encoding module are configured to create the encoder, and the block diagram of the corresponding structure is as FIG. 8, wherein:

The correction module is used to correct the non-negative values in the read basic matrix Hb according to the code length of the present data stream, and the realization of the correction module should be consistent with the correction mode applied in filling, and the code length of the data stream is offered by the data stream detection module in the system.

The extension module is used to extend the corrected basic matrix according to the extension factor and the basic permutation matrix to obtain the (M×z)×(N×z) parity check matrix of the LDPC codes. Unit matrix is generally chosen to be the basic permutation matrix, and when extending, it only needs to replace '−1' in the basic matrix with 0 matrix and replace other non-negative coefficients j with a z×z unit matrix after rotate right j-time.

The encoding module is used to perform the encoding operation from the (N−M)×z bit source data to N×z bit code based on said parity check matrix of LDPC codes obtained by the extension, which actually implements the multiplication and addition of the sparse matrix by hardware or software. Specifically it can apply the foregoing direct method, Richardson method or any other method.

If one basic matrix is configured for each code length, the basic matrix corresponding to each possible code length is stored in the basic matrix storage module, then, the foregoing correction module can be cancelled.

Additionally, the encoding can be directly performed using the basic matrix rather than the extension module. Since the basic matrix is actually the compression form of the parity check matrix, the encoding of LDPC codes can theoretically be realized by the parity check matrix, but formally by the basic matrix. For example, the operation of a rotate right 1-time z×z unit matrix multiplying with a z×1 column vector equals to left shifting the vector one bit (the number of elements in the basic matrix is the number of bits of shifting). The operation of a parity check matrix can always equivalently find the corresponding vector operation of the basic matrix, therefore, the encoding process based on the parity check matrix can be directly realized by the basic matrix, with the same principle, method and process.

Two examples of the encoder of the irregular LDPC code with variable code length and specific code rate based on the unit matrix and its cyclic shift matrix will be offered as follows:

The first:

An encoder of the irregular LDPC code with variable code length and specific code rate based on the unit matrix and its cyclic shift matrix, wherein the code rate is 3/4, the code length ranges from 576 to 2304 with 96 as the step length, and the extension factor z ranges from 24 to 96. This encoder includes the basic matrix storage module, the basic matrix correction module and the encoding module, wherein:

Said basic matrix storage module stores the following 6×24 matrix Hb:

| −1 | 81 | −1 | 28 | −1 | −1 | 14 | 25 | 17 | −1 | −1 | 85 | 29 | 52 | 78 | 95 | 22 | 92 | 20 | 0 | −1 | −1 | −1 | −1 |
| 42 | −1 | 14 | 68 | 32 | −1 | −1 | −1 | −1 | 70 | 43 | 11 | 36 | 40 | 33 | 57 | 38 | 24 | −1 | 0 | 0 | −1 | −1 | −1 |
| −1 | −1 | 20 | −1 | −1 | 63 | 39 | −1 | 70 | 67 | −1 | 38 | 4 | 72 | 47 | 29 | 60 | 5 | 0 | −1 | 0 | 0 | −1 | −1 |

| 64 | 2 | −1 | −1 | 63 | −1 | −1 | 3 | 51 | −1 | 81 | 15 | 94 | 9 | 85 | 36 | 14 | 19 | −1 | −1 | −1 | 0 | 0 | −1 |
|---|---|---|---|---|---|---|---|---|---|---|---|---|---|---|---|---|---|---|---|---|---|---|---|
| −1 | 53 | 60 | 80 | −1 | 26 | 75 | −1 | −1 | −1 | −1 | 86 | 77 | 1 | 3 | 72 | 60 | 25 | −1 | −1 | −1 | −1 | 0 | 0 |
| 77 | −1 | −1 | −1 | 15 | 28 | −1 | 35 | −1 | 72 | 30 | 68 | 85 | 84 | 26 | 64 | 11 | 89 | 20 | −1 | −1 | −1 | −1 | 0 |

Said basic matrix correction module corrects the non −1 value elements of the basic matrix according to the extension factor corresponding to the code length N of the current encoding, and the corrected value of the elements should be less than the value of the extension factor at the same code length. The correction algorithm applies integer operation. Pi,j is supposed to be the non-negative element on the $i^{th}$ row and $j^{th}$ column of the basic matrix, $P_{i,j}'$ is the corrected element, there is:

$$P'_{ij} = \left\lfloor P_{ij} \times \frac{N}{2304} \right\rfloor$$

Wherein N is the code length of LDPC codes of the parity check matrix to be created, $\lfloor\ \rfloor$ is the floor operation.

Said encoding module is used to perform the encoding from the (N−M)×z bit source data to the N×z bit code word according to said corrected basic matrix, which applies said basic matrix or the parity check matrix obtained by extending said basic matrix.

The second:

An encoder of the irregular LDPC codes with variable code length and specific code rate based on the unit matrix and its cyclic shift matrix, wherein the code rate is 5/6, the code length ranges from 576 to 2304 with 96 as the step length, and the extension factor z ranges from 24 to 96. This encoder includes the basic matrix storage module, the basic matrix correction module and the encoding module, wherein:

Said basic matrix storage module stores the following 4×24 matrix Hb:

In step 160, a decoding module is configured to constitute the decoder together with the basic matrix storage module, the correction module and the extension module (optional), also as shown in FIG. 8, wherein the decoding module is used for said parity check matrix of the LDPC codes obtained via extension to correct and output the input interfered codeword bits based on said basic matrix. Specifically, the available message passing algorithm can be used as the decoding algorithm, but the present invention is not limited to this.

Correspondingly, on the basis of the above two encoders of the irregular LDPC codes with variable code length and the special code rate based on the unit matrix and its cyclic shift matrix, the encoding module herein is replaced with the decoding module, leaving the applied basic matrix storage module and the correction module unchanged, then the corresponding two decoders of the irregular LDPC code with variable code length and the special code rate based on the unit matrix and its cyclic shift matrix are obtained.

Figure 9:
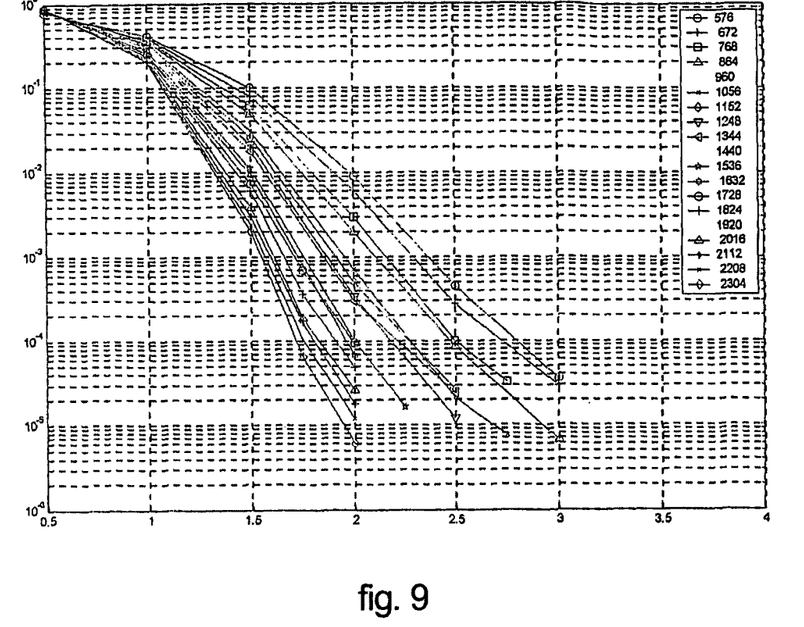
FIG. 9 is the frame error ratio of the low density parity check codes with 19 kinds of code lengths created by an embodiment of a basic matrix with 1/2 code rate according to the present invention.
Figure 10:
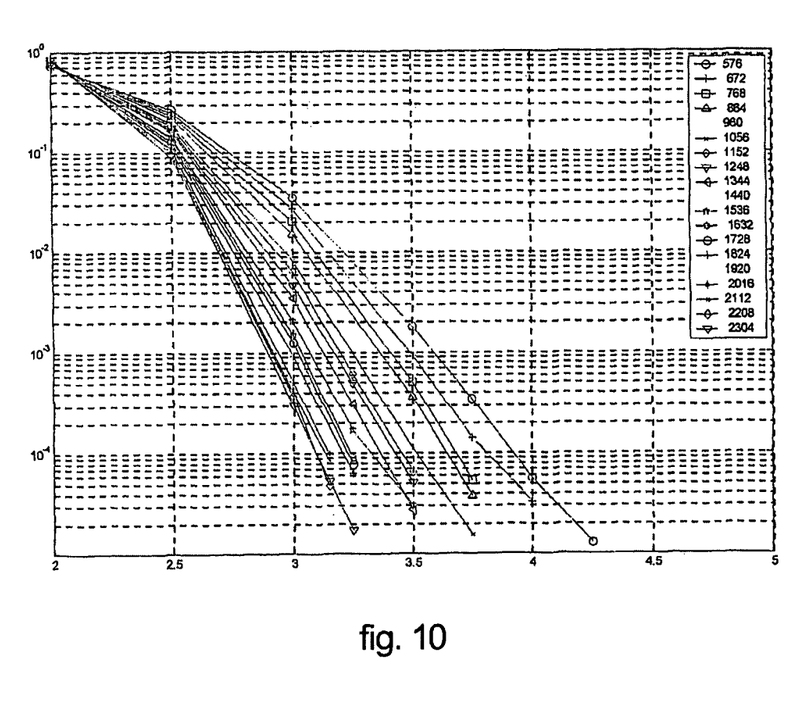
FIG. 10 is the frame error ratio of the low density parity check codes with 19 kinds of code lengths created by an embodiment of a basic matrix with 3/4 code rate according to the present invention.
Figure 11:
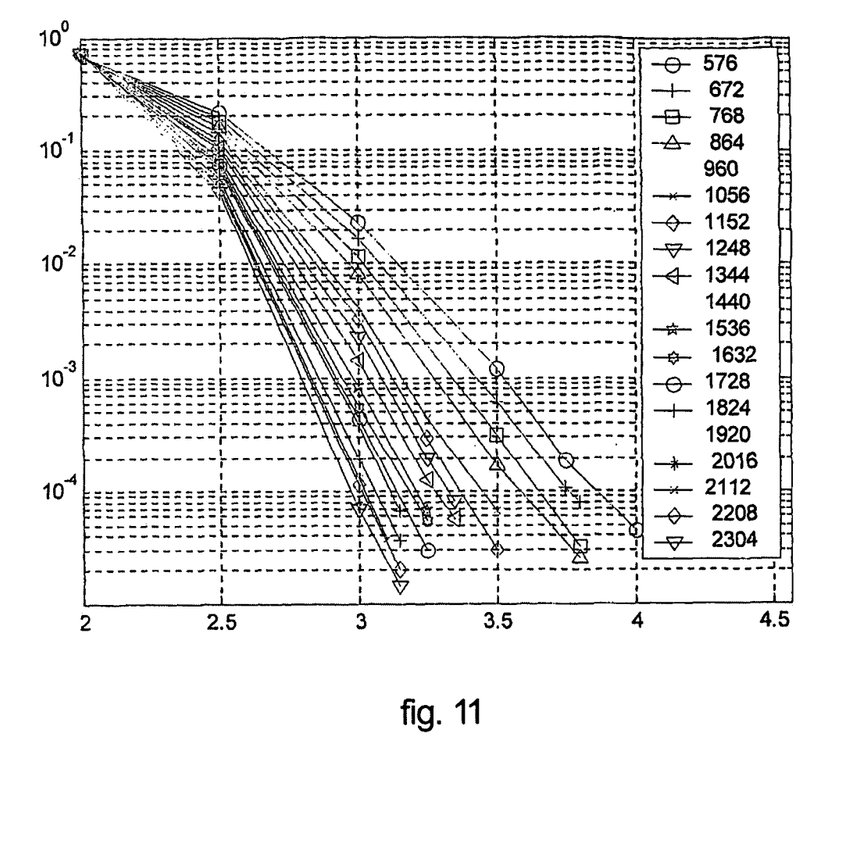
FIG. 11 is the frame error ratio of the low density parity check codes with 19 kinds of code lengths created by an embodiment of a totally irregular code basic matrix with 3/4 code rate according to the present invention.

FIG. 9 gives the performance of frame error ratio of the LDPC codes of 19 code lengths created according to a basic matrix example of 1/2 code rate in an example of the present invention in BPSK modulation, additive Gauss write noise channel and standard letter decoding 50 iterations. FIG. 10 gives the performance of the LDPC codes of 19 code lengths created according to a basic matrix example of 3/4 code rate of the present invention in the equivalent conditions, and FIG. 11 gives the performance of frame error ratio of the LDPC codes of 19 code lengths created according to a totally irregular code basic matrix example of 3/4 code rate of the present invention. From the figures, it can be seen that the present invention can ensure that LDPC codes with all code lengths

| 1 | 25 | 55 | −1 | 47 | 4 | −1 | 91 | 84 | 8 | 86 | 52 | 82 | 33 | 5 | 0 | 36 | 20 | 4 | 77 | 80 | 0 | −1 | −1 |
|---|---|---|---|---|---|---|---|---|---|---|---|---|---|---|---|---|---|---|---|---|---|---|---|
| −1 | 6 | −1 | 36 | 40 | 47 | 12 | 79 | 47 | −1 | 41 | 21 | 12 | 71 | 14 | 72 | 0 | 44 | 49 | 0 | 0 | 0 | 0 | −1 |
| 51 | 81 | 83 | 4 | 67 | −1 | 21 | −1 | 31 | 24 | 91 | 61 | 81 | 9 | 86 | 78 | 60 | 88 | 67 | 15 | −1 | −1 | 0 | 0 |
| 68 | −1 | 50 | 15 | −1 | 36 | 13 | 10 | 11 | 20 | 53 | 90 | 29 | 92 | 57 | 30 | 84 | 92 | 11 | 66 | 80 | −1 | −1 | 0 |

Said basic matrix correction module corrects the non −1 value elements of the basic matrix according to the extension factor corresponding to the code length N of the current encoding, and the corrected value of the elements should be less than the value of the extension factor at the same code length, and the correction algorithm applies integer operation. Pi,j is supposed to be the non-negative element on the ith row and jth column of the basic matrix, $P_{i,j}'$ is the corrected element, there is:

$$P'_{ij} = \left\lfloor P_{ij} \times \frac{N}{2304} \right\rfloor$$

Wherein N is the code length of LDPC codes of the parity check matrix to be created, $\lfloor\ \rfloor$ is the floor operation;

Said encoding module is used to perform the encoding from the (N−M)×z bit source data to the N×z bit code word according to said corrected basic matrix, and encoding operation performs the encoding using said basic matrix or the parity check matrix obtained by extending said basic matrix.

can overcome error-floor phenomena and the performance continuously becomes better with the increasing of code length, namely, within high SNR interval and under the condition of specific code rate, there is basically no cross between BER curves of different code lengths, and the speed of the iteration convergence is accelerated, and the error floors are effectively eliminated.

To sum up, the method of the present invention emphasizes the girth of LDPC codes to design good encoder and decoder of LDPC code, to generate a parity check matrix of LDPC codes characterized in high girth and variable code length under specific code rate, which can effectively eliminate the phenomenon of error floor of LDPC code, decrease the number of iteration convergence, obviously improve the performance of LDPC codes and have a good universal applicability.

The present invention may have many other embodiments. Variations and modifications may become apparent to those skilled in the art that do not necessarily depart from the essence and spirit of this invention. Thus, the invention described herein is intended to embrace all such modifications and variations as may fall within the scope of the appended claims.

INDUSTRIAL APPLICATION

The present invention can be used in the error-correction coding technology for data transmission in the digital communication system to obtain a kind of LDPC codes with desirable performance at high SNR.

What we claim is:

1. An encoder based on irregular low density parity check codes, with a variable code length and a specific code rate based on a unit matrix and a cyclic shift matrix of the unit matrix, wherein the code rate is 3/4, the code length ranges from 576 to 2304 with 96 as the step length, and the extension factor z ranges from 24 to 96; the encoder includes a basic matrix storage module, a basic matrix correction module and an encoding operation module, wherein:

said basic matrix storage module is configured to store a basic matrix consisting of a M×(N−M) block A corresponding to information bits and a M×M block B corresponding to check bits including the following 6/×24 matrix Hb:

| -1 | 81 | -1 | 28 | -1 | -1 | 14 | 25 | 17 | -1 | -1 | 85 | 29 | 52 | 78 | 95 | 22 | 92 | 20 | 0 | -1 | -1 | -1 | -1 |
| 42 | -1 | 14 | 68 | 32 | -1 | -1 | -1 | -1 | 70 | 43 | 11 | 36 | 40 | 33 | 57 | 38 | 24 | -1 | 0 | 0 | -1 | -1 | -1 |
| -1 | -1 | 20 | -1 | -1 | 63 | 39 | -1 | 70 | 67 | -1 | 38 | 4 | 72 | 47 | 29 | 60 | 5 | 0 | -1 | 0 | 0 | -1 | -1 |
| 64 | 2 | -1 | -1 | 63 | -1 | -1 | 3 | 51 | -1 | 81 | 15 | 94 | 9 | 85 | 36 | 14 | 19 | -1 | -1 | -1 | 0 | 0 | -1 |
| -1 | 53 | 60 | 80 | -1 | 26 | 75 | -1 | -1 | -1 | -1 | 86 | 77 | 1 | 3 | 72 | 60 | 25 | -1 | -1 | -1 | -1 | 0 | 0 |
| 77 | -1 | -1 | -1 | 15 | 28 | -1 | 35 | -1 | 72 | 30 | 68 | 85 | 84 | 26 | 64 | 11 | 89 | 20 | -1 | -1 | -1 | -1 | 0 | in said basic matrix, for all short cycles with length of 4, any element of i, j, k and l constituting the short cycle in anti-clockwise or clockwise always satisfies the inequality: (i−j+k−l) mod z≠0, wherein mod represents modular operation, and z is an extension factor, said encoding operation module is configured to perform the encoding from the (N−M)×z bit source data to the N×z bit code word according to the corrected basic matrix, and the encoding is performed by using said basic matrix or the parity check matrix obtained by extending said basic matrix, wherein an extension module is also included to extend said basic matrix according to the extension factor and a basic permutation matrix to obtain a (M×z)×(N×z) parity check matrix of low density parity check codes, and said encoding operation module performs the encoding operation based on the parity check matrix obtained from extension of said basic matrix, wherein said basic matrix also satisfies the following condition: said block B corresponding to check bits applies a quasi lower triangular structure; and said basic matrix is a unique basic matrix of low density parity check codes with a specific code rate and multiple code lengths, and after the values of elements in the basic matrix are corrected according to each of the code lengths, each basic matrix obtained satisfies all the inequalities satisfied by the basic matrix before the correction, said basic matrix correction module is configured to correct the elements with non −1 values in the basic matrix Hb according to the extension factor corresponding to the code length N of the current encoding, and the corrected values of the elements should be less than the value of the extension factor corresponding to the code length N; the correction algorithm applies scale+floor operation, and supposing $P_{i,j}$ is a non-negative element on the $i^{th}$ row and $j^{th}$ column of the basic matrix, and $P_{i,j}'$ is the corrected element, then there is:

$$P_{ij}' = \left\lfloor P_{ij} \times \frac{N}{2304} \right\rfloor$$

wherein N is the code length of low density parity check codes of the parity check matrix to be created, ⌊ ⌋ represents the operation which rounds the element to the nearest integer towards minus infinity, and wherein said basic matrix also satisfies the following condition: supposing the number of columns with the largest weight in the basic matrix Hb is r, then in each new basic matrix formed by deleting random r−1 columns herein, for all cycles with length of 4, any element of i, j, k and l constituting the cycle in anti-clockwise or clockwise always satisfies the inequality: (i−j+k−l) mod z≠0; moreover, for all cycles with length of 6, any element of i, j, k, l, m and n constituting the cycle in anti-clockwise or clockwise always satisfies the inequality: (i−j+k−l+m−n) mod z≠0.

2. The encoder as claimed in claim 1, wherein the following condition is also satisfied: supposing the number of columns with the largest weight in the basic matrix Hb is r, then in each new basic matrix formed by deleting random r−1 columns and all columns with weight of 3 therein, for all short cycles with length of 4, any element of i, j, k and l constituting the short cycle in anti-clockwise or clockwise always satisfies the inequality: (i−j+k−l) mod z≠0; moreover, for all short cycles with length of 6, any element of i, j, k, l, m and n constituting the short cycle in anti-clockwise or clockwise always satisfies the inequality: (i−j+k−l+m−n) mod z≠0.

3. The encoder as claimed in claim 1, wherein the encoder also includes a correction module configured to read the basic matrix according to the code length of a current data stream, correct non-negative values in the basic matrix and forward the basic matrix to a subsequent processing module.

4. The encoder as claimed in claim 1, wherein the encoder also includes a correction module configured to read the basic matrix according to the code length of a current data stream, correct non-negative values in the basic matrix and forward the basic matrix to a subsequent processing module.

5. An encoder based on irregular low density parity check codes, with a variable code length and a specific code rate based on a unit matrix and a cyclic shift matrix of the unit matrix, wherein the code rate is 5/6, the code length ranges from 576 to 2304 with 96 as the step length, and the extension factor z ranges from 24 to 96; the encoder includes a basic matrix storage module, a basic matrix correction module and an encoding operation module, wherein:

said basic matrix storage module is configured to store a basic matrix consisting of a M×(N−M) block A corresponding to information bits and a M×M block B corresponding to check bits including the following 4×24 matrix Hb:

| 1 | 25 | 55 | −1 | 47 | 4 | −1 | 91 | 84 | 8 | 86 | 52 | 82 | 33 | 5 | 0 | 36 | 20 | 4 | 77 | 80 | 0 | −1 | −1 |
|---|---|---|---|---|---|---|---|---|---|---|---|---|---|---|---|---|---|---|---|---|---|---|---|
| −1 | 6 | −1 | 36 | 40 | 47 | 12 | 79 | 47 | −1 | 41 | 21 | 12 | 71 | 14 | 72 | 0 | 44 | 49 | 0 | 0 | 0 | 0 | −1 |
| 51 | 81 | 83 | 4 | 67 | −1 | 21 | −1 | 31 | 24 | 91 | 61 | 81 | 9 | 86 | 78 | 60 | 88 | 67 | 15 | −1 | −1 | 0 | 0 |
| 68 | −1 | 50 | 15 | −1 | 36 | 13 | 10 | 11 | 20 | 53 | 90 | 29 | 92 | 57 | 30 | 84 | 92 | 11 | 66 | 80 | −1 | −1 | 0; | in said basic matrix, for all short cycles with length of 4, any element of i, j, k and l constituting the short cycle in anti-clockwise or clockwise always satisfies the inequality: (i−j+k−l) mod z≠0, wherein mod represents modular operation, and z is an extension factor;

said encoding operation module is configured to perform an encoding from the source data of (N−M)×z bit to the N×z bit code word according to the corrected basic matrix, and the encoding is performed by using said basic matrix or the parity check matrix obtained by extending said basic matrix wherein an extension module is also included to extend said basic matrix according to the extension factor and a basic permutation matrix to obtain a (M×z)×(N×z) parity check matrix of low density parity check codes, and said encoding operation module performs the encoding operation based on the parity check matrix obtained from extension of said basic matrix, wherein said basic matrix also satisfies the following condition: said block B corresponding to check bits applies a quasi lower triangular structure; and said basic matrix is a unique basic matrix of low density parity check codes with a specific code rate and multiple code lengths, and after the values of elements in the basic matrix are corrected according to each of the code lengths, each basic matrix obtained satisfies all the inequalities satisfied by the basic matrix before the correction, said basic matrix correction module is configured to correct the elements with non −1 values in the basic matrix Hb according to the extension factor corresponding to the code length N of the current encoding, and the corrected values of the elements should be less than the value of the extension factor corresponding to the code length N, and the correction algorithm applies scale+floor operation; supposing $P_{i,j}$ is a non-negative element on the $i^{th}$ row and $j^{th}$ column of the basic matrix, and $P_{i,j}'$ is the corrected element, then there is:

$$P'_{ij} = \left\lfloor P_{ij} \times \frac{N}{2304} \right\rfloor$$

wherein N is the code length of low density parity check codes of the parity check matrix to be created, $\lfloor \ \rfloor$ represents the operation which rounds the element to the nearest integer towards minus infinity; and wherein said basic matrix also satisfies the following condition: supposing the number of columns with the largest weight in the basic matrix Hb is r, then in each new basic matrix formed by deleting random r−1 columns herein, for all cycles with length of 4, any element of i, j, k and l constituting the cycle in anti-clockwise or clockwise always satisfies the inequality: (i−j+k−l) mod z≠0; moreover, for all cycles with length of 6, any element of i, j, k, l, m and n constituting the cycle in anti-clockwise or clockwise always satisfies the inequality: (i−j+k−l+m−n) mod z≠0.

6. The encoder as claimed in claim 5, wherein the following condition is also satisfied: supposing the number of columns with the largest weight in the basic matrix Hb is r, then in each new basic matrix formed by deleting random r−1 columns and all columns with weight of 3 therein, for all short cycles with length of 4, any element of i, j, k and l constituting the short cycle in anti-clockwise or clockwise always satisfies the inequality: (i−j+k−l) mod z≠0; moreover, for all short cycles with length of 6, any element of i, j, k, l, m and n constituting the short cycle in anti-clockwise or clockwise always satisfies the inequality: (i−j+k−l+m−n) mod z≠0.

7. The encoder as claimed in claim 5, wherein the encoder also includes a correction module configured to read the basic matrix according to the code length of a current data stream, correct non-negative values in the basic matrix and forward the basic matrix to a subsequent processing module.

\* \* \* \* \*